(12) United States Patent
Park et al.

(10) Patent No.: US 9,252,800 B1
(45) Date of Patent: Feb. 2, 2016

(54) ENHANCED RESOLUTION SUCCESSIVE-APPROXIMATION REGISTER ANALOG-TO-DIGITAL CONVERTER AND METHOD

(71) Applicant: Texas Instruments Incorporated, Dallas, TX (US)

(72) Inventors: Joonsung Park, Dallas, TX (US); Krishnaswamy Nagaraj, Plano, TX (US); Mikel Ash, Cedar Park, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/462,916

(22) Filed: Aug. 19, 2014

(51) Int. Cl.
  *H03M 1/38* (2006.01)
  *H03M 1/20* (2006.01)
  *H03M 1/46* (2006.01)

(52) U.S. Cl.
  CPC *H03M 1/20* (2013.01); *H03M 1/38* (2013.01); *H03M 1/462* (2013.01)

(58) Field of Classification Search
  CPC .......... H03M 1/20; H03M 1/462; H03M 1/38
  USPC .................................................. 341/161, 163
  See application file for complete search history.

(56) References Cited

U.S. PATENT DOCUMENTS

| | | | |
|---|---|---|---|
| 7,605,741 B2* | 10/2009 | Hurrell | 341/163 |
| 7,928,880 B2* | 4/2011 | Tsukamoto | 341/144 |
| 8,497,795 B2* | 7/2013 | Le Tual et al. | 341/163 |
| 8,947,286 B2* | 2/2015 | Chen | 341/161 |

OTHER PUBLICATIONS

Schreier, Richard, et al.; "Understanding Delta-Sigma Data Converters"; Chapter 1, pp. 1-4; ISBN: 978-0-471-46585-0; Published Nov. 2004; Wiley-IEEE Press; 5 pages.
Maloberti, Franco; "Data Converters"; Chapter 4, pp. 178-183; Chapter 6, pp. 253-257; ISBN: 13-978-0-387-32485-2 (HB); Published 2007; Springer; 7 pages.

* cited by examiner

*Primary Examiner* — Brian Young
(74) *Attorney, Agent, or Firm* — John R. Pessetto; Frank D. Cimino

(57) ABSTRACT

An enhanced resolution successive-approximation register (SAR) analog-to-digital converter (ADC) is provided that includes a digital-to-analog converter (DAC), a comparator and enhanced resolution SAR control logic. The DAC includes analog circuitry that is configured to convert an M-bit digital input to an analog output. The comparator includes a plurality of coupling capacitors. The enhanced resolution SAR control logic is configured to generate an M-bit approximation of an input voltage and to store a residue voltage in at least one of the coupling capacitors. The residue voltage represents a difference between the input voltage and the M-bit approximation of the input voltage. The enhanced resolution SAR control logic is further configured to generate an N-bit approximation of the input voltage based on the stored residue voltage, where N>M.

17 Claims, 8 Drawing Sheets

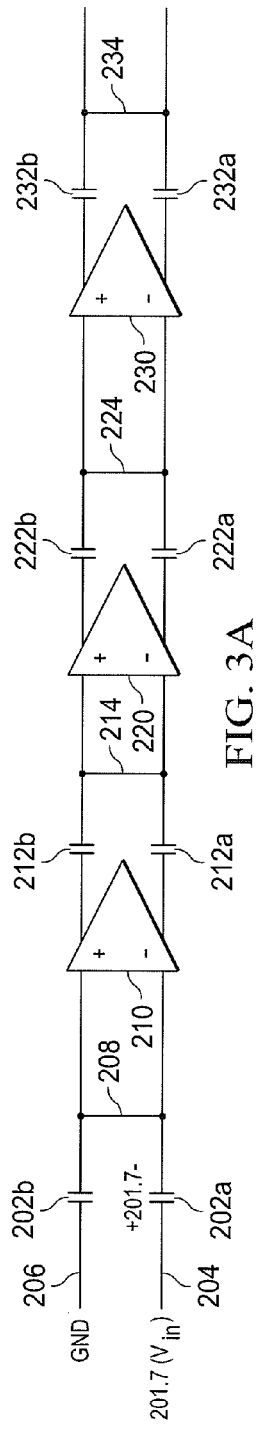
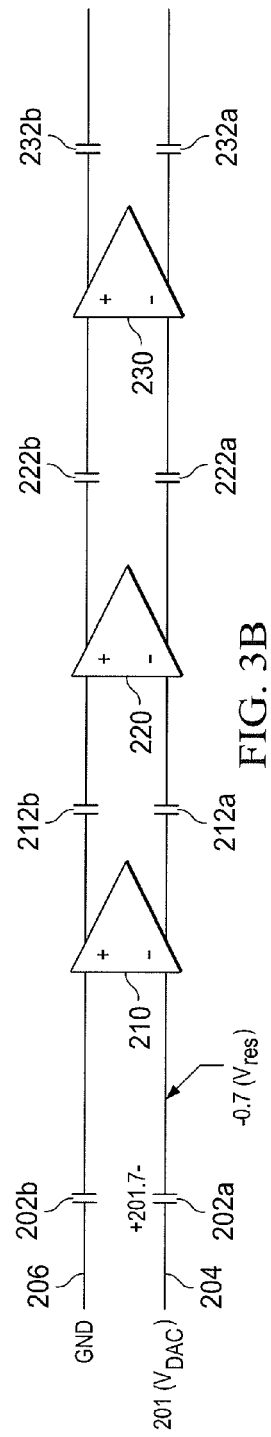
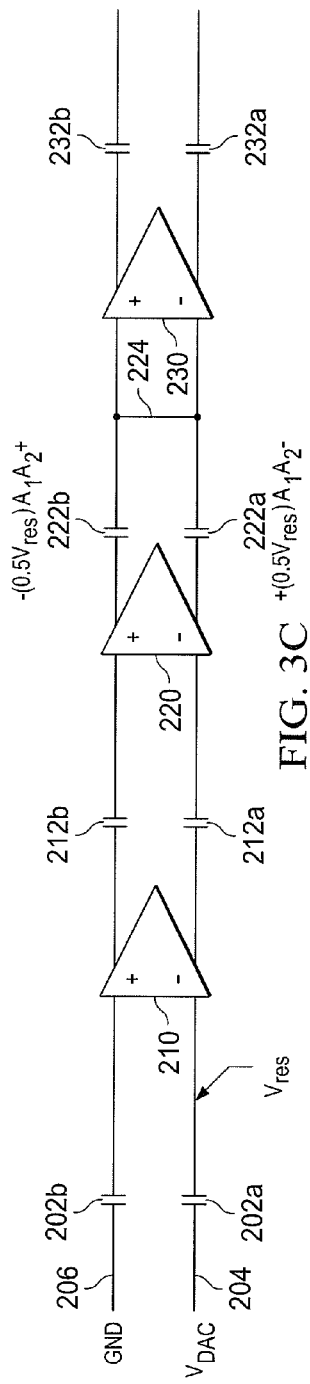

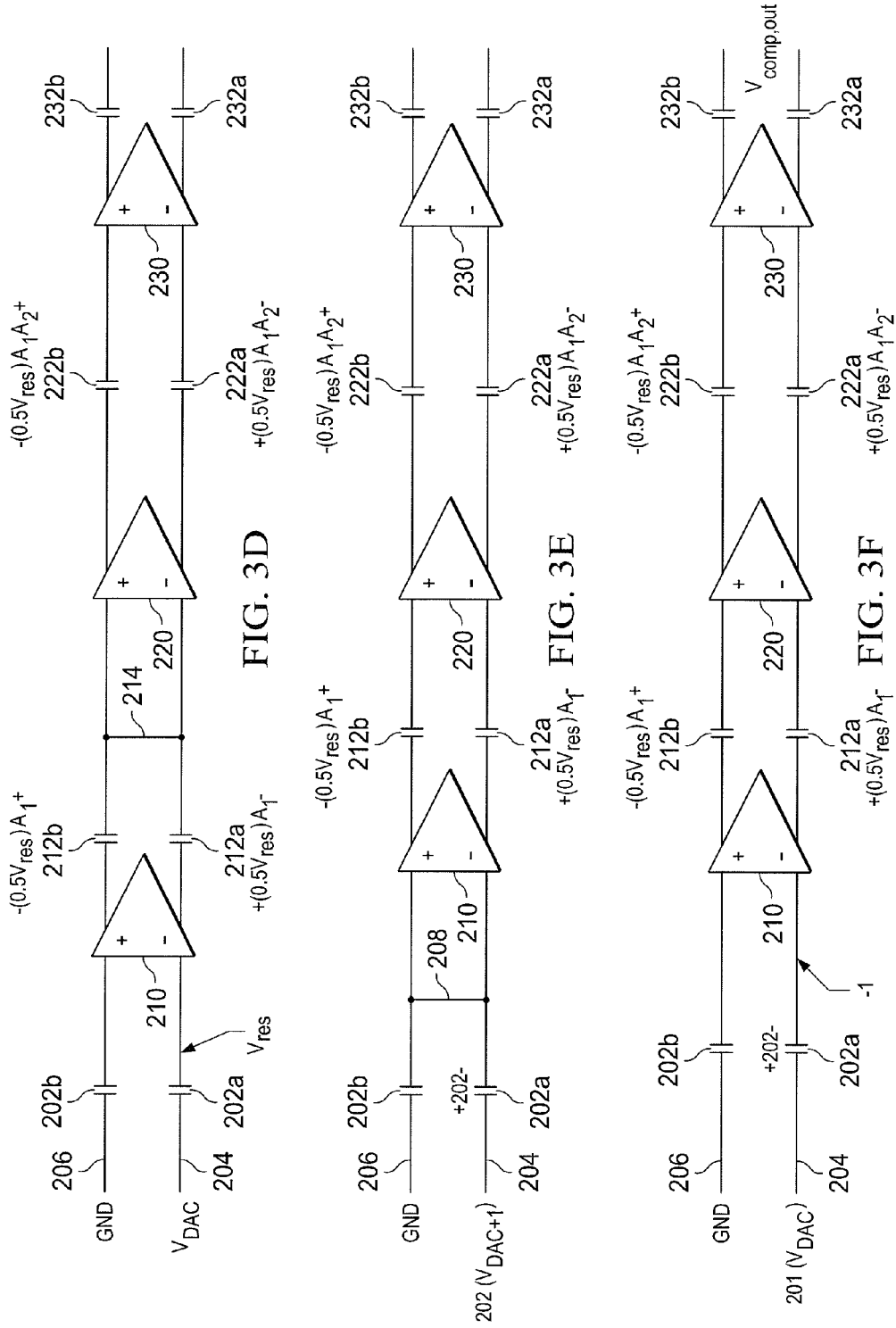

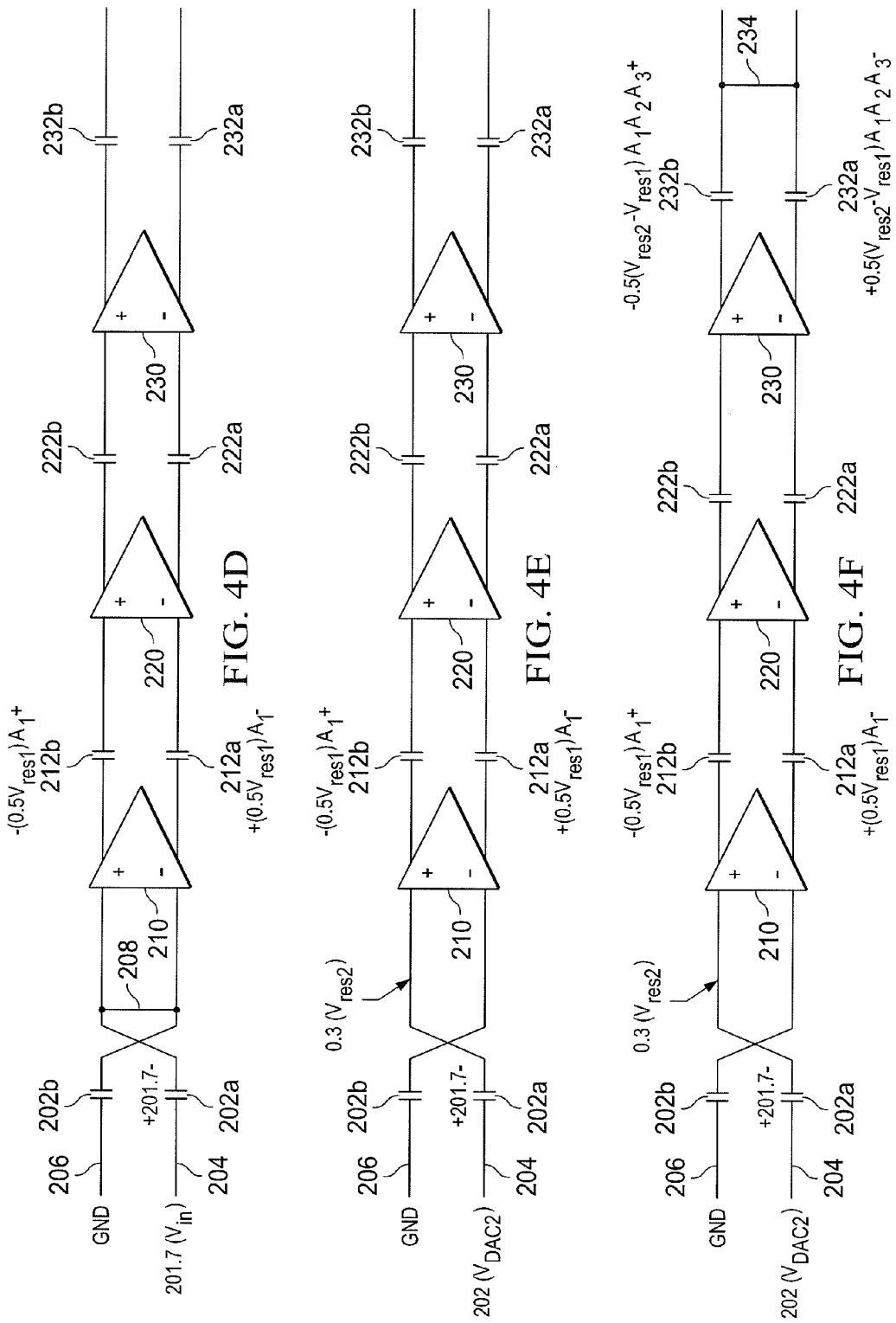

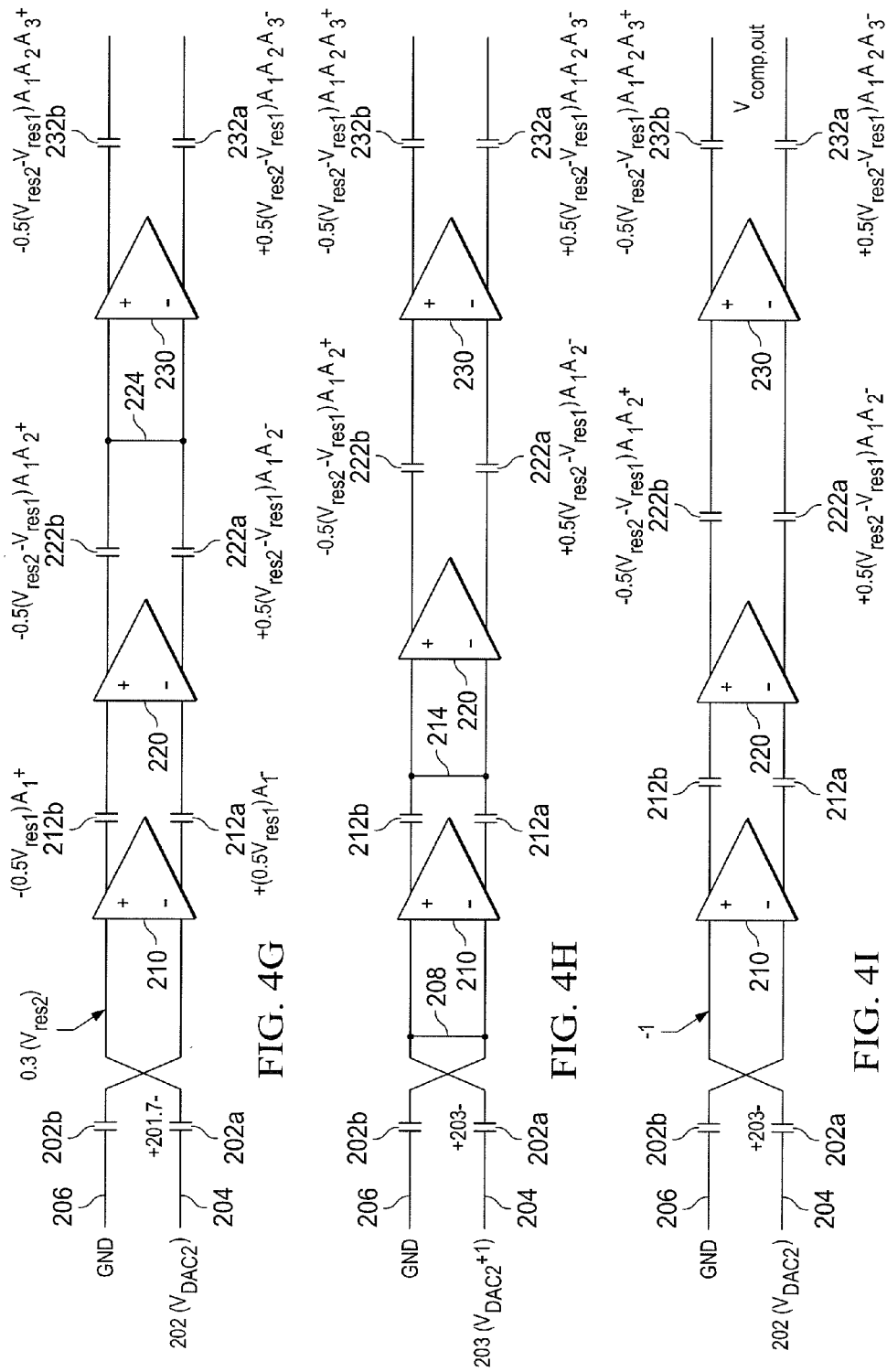

ENHANCED RESOLUTION SUCCESSIVE-APPROXIMATION REGISTER ANALOG-TO-DIGITAL CONVERTER AND METHOD

TECHNICAL FIELD

This disclosure is generally directed to analog-to-digital converters (ADCs). More specifically, this disclosure is directed to an enhanced resolution successive-approximation register (SAR) ADC and method.

BACKGROUND

In a conventional SAR ADC, increasing the resolution results in a corresponding increase in area and power consumption. For example, a 1-bit increase in resolution typically results in a doubling of the number of components in a digital-to-analog converter (DAC) array for the SAR ADC. In order to increase the resolution without a considerable increase in power and area, one solution is to incorporate oversampling in the ADC. However, the conventional use of oversampling results in a reduced input signal bandwidth, a reduction in ADC speed, and degraded linearity performance.

SUMMARY

This disclosure provides an enhanced resolution SAR ADC and method.

In one example, an enhanced resolution SAR ADC is provided that includes a DAC, a comparator and enhanced resolution SAR control logic. The DAC includes analog circuitry that is configured to convert an M-bit digital input to an analog output. The comparator includes a plurality of coupling capacitors. The enhanced resolution SAR control logic is configured to generate an M-bit approximation of an input voltage and to store a residue voltage in at least one of the coupling capacitors. The residue voltage represents a difference between the input voltage and the M-bit approximation of the input voltage. The enhanced resolution SAR control logic is further configured to generate an N-bit approximation of the input voltage based on the stored residue voltage, where N is larger than M.

In another example, a method for increasing the resolution of a SAR ADC is provided that includes generating an M-bit approximation of an input voltage. A residue voltage is determined based on the input voltage and the M-bit approximation of the input voltage. The residue voltage is stored in at least one coupling capacitor. An N-bit approximation of the input voltage is generated based on the stored residue voltage, wherein N=M+1.

In a third example, a method for increasing the resolution of a SAR ADC is provided that includes generating an M-bit approximation of an input voltage. A first residue voltage is determined based on the input voltage and the M-bit approximation of the input voltage. The first residue voltage is stored in a first coupling capacitor. A second residue voltage is determined based on the input voltage and the M-bit approximation of the input voltage. A difference between the first and second residue voltages is stored in a second coupling capacitor and a third coupling capacitor. An N-bit approximation of the input voltage is generated based on the stored difference, wherein N=M+2.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIGS. 3A through 3F illustrate an example of a method for increasing the resolution of the SAR ADC of FIG. 1 by one bit according to an embodiment of this disclosure;

FIGS. 4A through 4I illustrate an example of a method for increasing the resolution of the SAR ADC of FIG. 1 by two bits according to an embodiment of this disclosure;

DETAILED DESCRIPTION

FIGS. 1 through 6, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
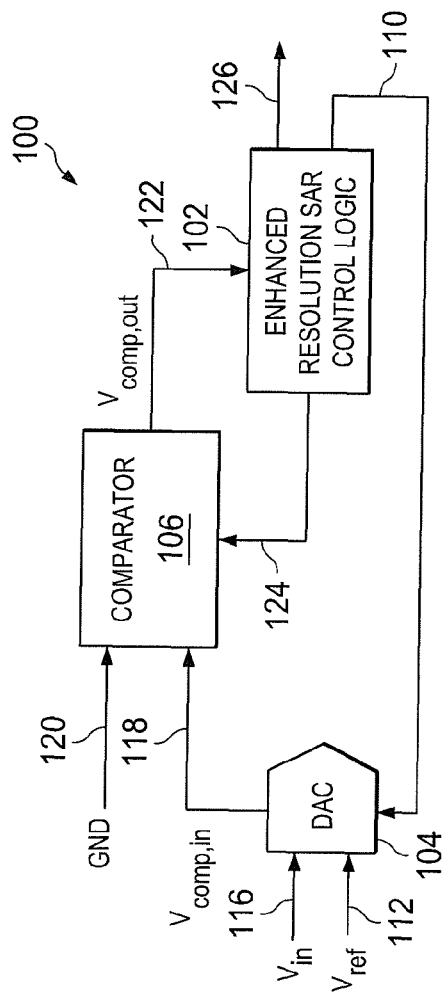
FIG. 1 illustrates an enhanced resolution successive-approximation register (SAR) analog-to-digital converter (ADC) according to an embodiment of this disclosure.

FIG. 1 illustrates an enhanced resolution successive-approximation register (SAR) analog-to-digital converter (ADC) 100 according to an embodiment of this disclosure. The embodiment of the enhanced resolution SAR ADC 100 shown in FIG. 1 is for illustration only. Other embodiments of the enhanced resolution SAR ADC 100 could be used without departing from the scope of this disclosure.

The enhanced resolution SAR ADC 100 includes enhanced resolution SAR control logic 102, a digital-to-analog converter (DAC) 104, and a comparator 106. The enhanced resolution SAR control logic 102 is configured to enhance the resolution of the enhanced resolution SAR ADC 100 by storing residue voltage in existing capacitors in the comparator 106. Thus, as used in this disclosure, "enhanced resolution SAR control logic" refers to SAR control logic that is configured to implement a residue boosting algorithm such that analog circuitry for providing M-bit resolution instead provides N-bit resolution without modifications to the analog circuitry. For the embodiments described below, N=M+1 or N=M+2. Therefore, because the analog circuitry of a conventional M-bit SAR ADC is not modified, the enhanced resolution SAR ADC 100 may provide N-bit resolution without increasing power consumption or area requirements and without reducing input signal bandwidth, speed or linearity performance as compared to a conventional M-bit SAR ADC.

The enhanced resolution SAR control logic 102 is configured to generate an M-bit digital code 110 for the DAC 104. The DAC 104 is configured to receive the digital code 110, an input voltage, $V_{in}$, 116 and a reference voltage signal, $V_{ref}$, 112 and to generate an analog voltage signal, $V_{comp,in}$, 118 based on the digital code 110, $V_{ref}$ 112 and $V_{in}$ 116. For some embodiments, including in the example described below, the DAC 104 may include a capacitor array. However, for other embodiments, the DAC 104 may include a resistor array, a combination of a capacitor array and a resistor array, or any other suitable components.

The comparator 106 is configured to receive $V_{comp,in}$ 118 and a ground (GND) signal 120 and to generate a comparator output, $V_{comp,out}$, 122 based on $V_{comp,in}$ 118 and the ground signal 120. The comparator 106 may include a plurality of amplifiers coupled to each other through coupling capacitors, which are auto-zero capacitors. In addition, the enhanced resolution SAR control logic 102 is configured to provide a control signal 124 to the comparator 106 to provide residue boosting for increased resolution, as described in more detail below. Therefore, based on the residue boosting, the enhanced resolution SAR control logic 102 is configured to generate an N-bit approximation 126 of $V_{in}$ 116 as an output of the enhanced resolution SAR ADC 100 instead of generating an M-bit approximation.

For some embodiments, including the example described below, the word length of the digital code 110 is the same as the word length of the M-bit approximation of $V_{in}$ 116. However, for other embodiments, the word length of the digital code 110 may be different from the word length of the M-bit approximation of $V_{in}$ 116. For example, the digital code 110 can be a $2^M$-bit thermometric code that is logically equivalent to M-bit binary code.

In operation, for obtaining the M bits of the digital code 110, the enhanced resolution SAR ADC 100 functions in a conventional manner. Thus, initially, the enhanced resolution SAR control logic 102 forces the first bit of the digital code 110 high and the remaining bits of the digital code 110 are low. For example, for M=12, the digital code 110 is initially 100000000000. This digital code 110 corresponds to ½ of $V_{ref}$ 112.

The DAC 104 then generates $V_{comp,in}$ 118 using the digital code 110, $V_{ref}$ 112 and $V_{in}$ 116. Thus, initially, the DAC 104 generates $V_{comp,in}$ 118 by multiplying $V_{ref}$ 112 by ½ and subtracting $V_{in}$ 116 from it. The comparator 106 then compares $V_{comp,in}$ 118 to ground 120 to generate $V_{comp,out}$ 122. If $V_{in}$ 116>½*$V_{ref}$ 112, the comparator 106 generates a high $V_{comp,out}$ 122 and the enhanced resolution SAR control logic 102 keeps the first bit of the digital code 110 high. Similarly, if $V_{in}$ 116<½*$V_{ref}$ 112, the comparator 106 generates a low $V_{comp,out}$ 122 and the enhanced resolution SAR control logic 102 changes the first bit of the digital code 110 to low. The enhanced resolution SAR control logic 102 then forces the second bit of the digital code 110 high and repeats the process.

Thus, if the first bit was kept high, the subsequent digital code 110 generated by the enhanced resolution SAR control logic 102 is 110000000000, which will result in the DAC 104 multiplying $V_{ref}$ 112 by ¾. Similarly, if the first bit was changed to low, the subsequent digital code 110 generated by the enhanced resolution SAR control logic 102 is 010000000000, which will result in the DAC 104 multiplying $V_{ref}$ 112 by ¼. This process continues, with the next iteration multiplying $V_{ref}$ 112 by ⅞, ⅝, ⅜ or ⅛ depending on the previous outcomes, until a first full M-bit conversion has been completed, which converts $V_{in}$ 116 into an M-bit approximation of $V_{in}$ 116.

At this point, the enhanced resolution SAR control logic 102 may obtain one or two additional bits of resolution by generating the control signal 124 to prompt the comparator 106 to store residue voltage in the coupling capacitors of the comparator 106. This boosted residue voltage is converted to a digital value by itself or added to the next sample to achieve higher resolution.

For example, as described in more detail below, the enhanced resolution SAR control logic 102 may use residue boosting to obtain a value of twice the residue voltage. Thus, instead of generating a value half the size of the previously obtained M-bit digital code 110 for comparison purposes, which would double the size of the capacitor array in the DAC 104, the value of twice the residue voltage may be used to obtain the same result without affecting the size of the capacitor array. The enhanced resolution SAR control logic 102 may use this doubled residue voltage to obtain one additional bit of the digital code 110. Similarly, the enhanced resolution SAR control logic 102 may use residue boosting to obtain a value of four times the residue voltage, which may be used to obtain a second additional bit of the digital code 110, without quadrupling the size of the capacitor array.

As a result, the bit resolution of the enhanced resolution SAR ADC 100 may be increased by up to two bits without modifying analog circuits such that the area and power consumption of the enhanced resolution SAR ADC 100 are not increased as compared to a SAR ADC without the increased resolution. Thus, instead of increasing the number of elements in a capacitor-DAC or resistor-DAC, the number of elements in the DAC 104 does not need to be increased. Thus, the N-bit enhanced resolution SAR ADC 100 does not need to be modified as compared to an M-bit SAR ADC, with the exception of the addition of a small digital logic block and a small number of analog hooks.

Furthermore, instead of oversampling the analog input in a conventional manner, which reduces the quantization noise but not nonlinearity errors, the enhanced resolution SAR ADC 100 oversamples the analog input $V_{in}$ 116 only $2^x$ times (where x represents the increase of resolution in number of bits). Thus, oversampling may be reduced by half as compared to conventional oversampling methods. In addition, by averaging out differential nonlinearity error, good linearity may be achieved. Thus, this method helps to achieve smaller nonlinearity error and increases the enhanced resolution SAR ADC 100 speed and input signal bandwidth as compared to previously implemented oversampling methods.

Although FIG. 1 illustrates one example of an enhanced resolution SAR ADC 100, various changes may be made to the embodiment of FIG. 1. For example, various components of the enhanced resolution SAR ADC 100 could be combined, further subdivided, moved, or omitted and additional components could be added according to particular needs.

Figure 2:
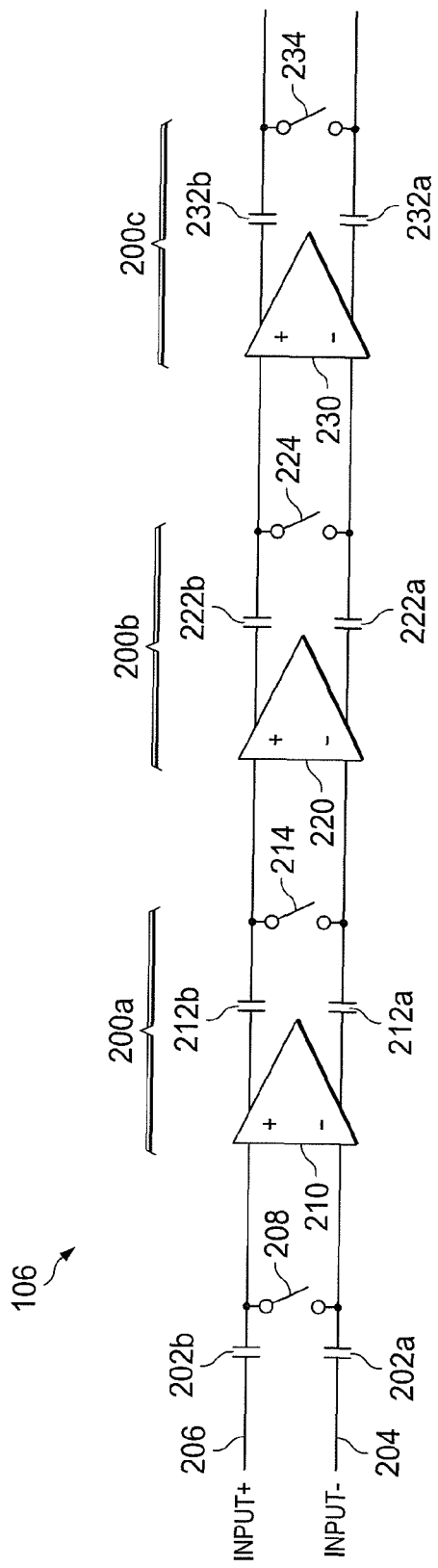
FIG. 2 illustrates the comparator of FIG. 1 according to an embodiment of this disclosure.

FIG. 2 illustrates the comparator 106 according to an embodiment of this disclosure. The embodiment of the comparator 106 shown in FIG. 2 is for illustration only. Other embodiments of the comparator 106 could be used without departing from the scope of this disclosure.

For the illustrated embodiment, the comparator 106 includes three stages 200a, 200b and 200c. However, it will be understood that the comparator 106 may include any suitable number of stages. The comparator 106 also includes a pair of input coupling capacitors 202a-202b. The capacitor 202a is configured to couple a first signal 204 to a negative input of the first stage 200a, and the capacitor 202b is configured to couple a second signal 206 to a positive input of the first stage 200a. It should be noted that in an embodiment using a capacitor array for the DAC 104, the coupling capacitors 202a-202b are formed by the DAC 104 itself. During the initial M-bit conversion process, the first signal 204 may correspond to $V_{comp,in}$ 122 and the second signal 206 may correspond to the ground signal 120. However, after the M bits of the digital code 110 are obtained, the first signal 204 may vary as described in more detail below. The comparator 106 also includes a switch 208 that is configured to couple and uncouple the capacitors 202a-202b to and from each other.

The first stage 200a includes an amplifier 210 that has a gain of $A_1$, a pair of coupling capacitors 212a-212b and a switch 214, the second stage 200b includes an amplifier 220 that has a gain of $A_2$, a pair of coupling capacitors 222a-222b and a switch 224, and the third stage 200c includes an amplifier 230 that has a gain of $A_3$, a pair of coupling capacitors 232a-232b and a switch 234. Each amplifier 210, 220 and 230 is configured to amplify its input signal to generate an amplified output. Each of the capacitors 212a-212b, 222a-222b and 232a-232b is an auto-zero capacitor through the use of the switches 214, 224 and 234.

The capacitors 212a-212b are configured to couple the amplified output of the amplifier 210 to the amplifier 220, the capacitors 222a-222b are configured to couple the amplified output of the amplifier 220 to the amplifier 230, and the capacitors 232a-232b are configured to provide the amplified output of the amplifier 230 as $V_{comp,out}$ 122. Each of the switches 214, 224 and 234 is configured to couple and uncouple the corresponding capacitors 212a-212b, 222a-222b and 232a-232b to and from each other.

Voltage representing a scaled version of the residue voltage may be stored in each pair of capacitors 212a-212b, 222a-222b and 232a-232b. Therefore, in order to multiply the residue voltage by 2 or 4 to obtain one or two bits of additional resolution, the capacitors 212a-212b, 222a-222b and 232a-232b can be sequentially strobed to obtain a scaled version of the residual voltage at any of the stages 200a, 200b or 200c. As described in more detail below, the enhanced resolution SAR control logic 102 uses these scaled versions of the residual voltage to obtain the additional bit or bits of resolution.

Although FIG. 2 illustrates one example of comparator 106, various changes may be made to the embodiment of FIG. 2. For example, various components of the comparator 106 could be combined, further subdivided, moved, or omitted and additional components could be added according to particular needs. For a particular example, the comparator 106 may include single-ended components instead of differential components. Thus, for this example, each amplifier 210, 220 and 230 and each pair of coupling capacitors 202a-202b, 212a-212b, 222a-222b and 232a-232b may be replaced with a corresponding single-ended amplifier or capacitor.

FIGS. 3A through 3F illustrate a method for increasing the resolution of the enhanced resolution SAR ADC 100 by one bit according to an embodiment of this disclosure. The embodiment shown as an example in FIGS. 3A through 3F is for illustration only. The resolution of the enhanced resolution SAR ADC 100 may be increased by one bit in any other suitable manner without departing from the scope of this disclosure.

The method is described with reference to the comparator 106 as described in connection with FIG. 2. For the particular example illustrated in FIGS. 3A through 3F, $V_{in}$=201.7, M=12, and N=13. It will be understood that these values are simply examples used to illustrate the method. In addition, it will be understood that the enhanced resolution SAR control logic 102 generates the control signal 124 to control the inputs 204 and 206 to the comparator 106 and the opening and closing of the switches 208, 214, 224 and 234.

As shown in FIG. 3A, the first signal 204 is initially $V_{in}$ or 201.7, and each of the switches 208, 214, 224 and 234 is closed. Thus, at this first step, 201.7 is stored on the capacitor 202a. For simplicity, in FIGS. 3B through 3F, only the switches 208, 214, 224 and 234 that are closed are illustrated, while the open switches 208, 214, 224 and 234 are not shown.

As shown in FIG. 3B, the first signal 204 is changed to $V_{DAC}$, which corresponds to an analog version of the 12-bit digital code 110 generated by the enhanced resolution SAR control logic 102. Thus, because $V_{in}$=201.7 in this example, the result of the initial conversion of $V_{in}$ to a 12-bit digital code 110 is the value 201. Therefore, the value of $V_{DAC}$ in this example is 201. The residue voltage that is typically discarded at this point is the remaining portion of $V_{in}$, which is 0.7. That is, $V_{in}=V_{DAC}+V_{res}$. At this step, each of the switches 208, 214, 224 and 234 is open. Thus, because the first signal 204 is $V_{DAC}$ (201) and the capacitor 202a is storing $V_{in}$ (201.7), the voltage at the input to the negative terminal of the amplifier 210 represents a negative value of $V_{res}$ or −0.7.

As shown in FIG. 3C, the first signal 204 remains $V_{DAC}$, and $V_{res}$ remains at the input to the negative terminal of the amplifier 210. At this step, the switch 224 is closed. Thus, a scaled version of the residue voltage (i.e., $V_{res}A_1A_2$) is stored differentially in the capacitors 222a-222b. As a result, the capacitors 222a-222b provide a first scaled version of $V_{res}$ to be used in residue boosting.

As shown in FIG. 3D, the first signal 204 remains $V_{DAC}$, and $V_{res}$ remains at the input to the negative terminal of the amplifier 210. At this step, the switch 224 has been opened, and the switch 214 is closed. Thus, a second scaled version of the residue voltage (i.e., $V_{res}A_1$) is stored differentially in the capacitors 212a-212b. As a result, the capacitors 212a-212b provide a second scaled version of $V_r$ to be used in residue boosting.

As shown in FIG. 3E, the first signal 204 is changed to $V_{DAC}+1$, which results in 202 in this example. At this step, the switch 214 has been opened, and the switch 208 is closed. Thus, the value of $V_{DAC}+1$, or 202, is stored on the capacitor 202a.

As shown in FIG. 3F, the first signal 204 is changed back to $V_{DAC}$, which is 201. At this step, the switch 208 has been opened. Thus, the value of $V_{DAC}-(V_{DAC}+1)$, or −1, is stored at the input to the negative terminal of the amplifier 210. At this point, the comparator output, $V_{comp,out}$ 122 is provided by $(1-2V_{res})A_1A_2A_3$. For the example, this result would be $-0.4A_1A_2A_3$.

The enhanced resolution SAR control logic 102 then determines the 13-bit approximation 126 of $V_{in}$ as follows:

if $V_{comp,out} > 0, V_{out} = 0,$ if $V_{comp,out} \leq 0, V_{out} = 1,$ and final output$=2V_{DAC}+V_{out}$.

Thus, for a residue voltage greater than 0.5, $V_{comp,out}$ is zero or negative and $V_{out}$ is 1, and for a residue voltage of 0.5 or less, $V_{comp,out}$ is positive and $V_{out}$ is 0. Accordingly, for the example illustrated in FIGS. 3A through 3F, $V_{out}$ is 1, and the final output is 2(201)+1=403. This final output corresponds to the 13-bit approximation 126 of $V_{in}$. Additional examples are shown in the table below:

| $V_{in}$ | $V_{DAC}$ | $V_{out}$ | Final output |
|---|---|---|---|
| 201.2 | 201 | 0 | 402 |
| 201.4 | 201 | 0 | 402 |
| 201.7 | 201 | 1 | 403 |
| 201.9 | 201 | 1 | 403 |

FIGS. 4A through 4I illustrate a method for increasing the resolution of the SAR ADC of FIG. 1 by two bits according to an embodiment of this disclosure. The embodiment shown as an example in FIGS. 4A through 4I is for illustration only. The resolution of the enhanced resolution SAR ADC 100 may be increased by two bits in any other suitable manner without departing from the scope of this disclosure.

The method is described with reference to the comparator 106 as described in connection with FIG. 2. For the particular example illustrated in FIGS. 4A through 4I, $V_{in}$=201.7, M=12, and N=14. It will be understood that these values are simply examples used to illustrate the method. In addition, it will be understood that the enhanced resolution SAR control logic 102 generates the control signal 124 to control the inputs 204 and 206 to the comparator 106 and the opening and closing of the switches 208, 214, 224 and 234.

Figure 4A:
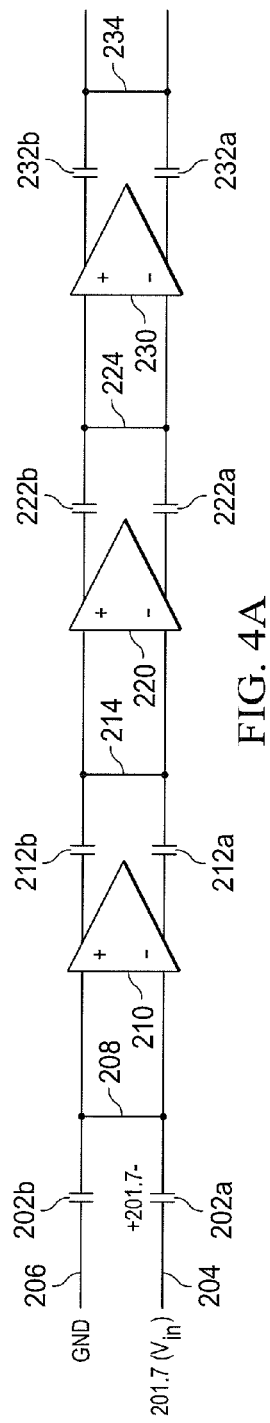

After a first conversion using a conventional process to obtain a 12-bit digital code 110, $V_{DAC1}$ represents the analog version of that 12-bit digital code 110. As shown in FIG. 4A, for a second conversion, the first signal 204 is initially $V_{in}$, or 201.7, and each of the switches 208, 214, 224 and 234 is closed. Thus, at this first step, 201.7 is stored on the capacitor 202a. For simplicity, in FIGS. 4B through 4I, only the switches 208, 214, 224 and 234 that are closed are illustrated, while the open switches 208, 214, 224 and 234 are not shown.

Figure 4B:
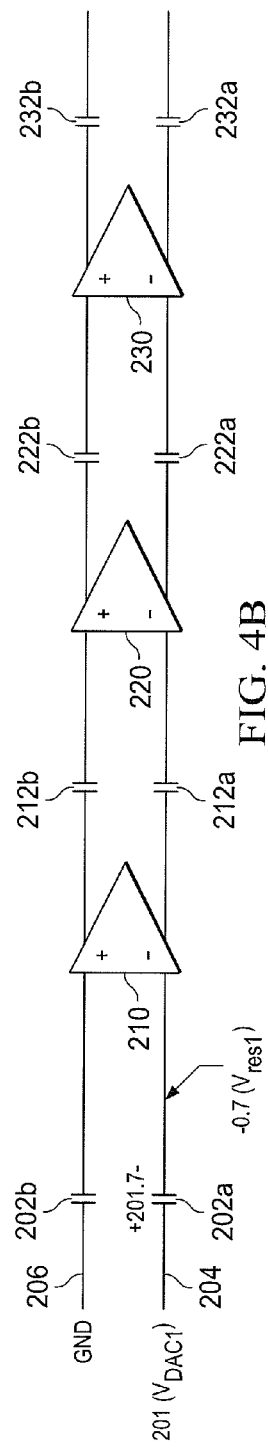

As shown in FIG. 4B, the first signal 204 is changed to $V_{DAC1}$. Thus, because $V_{in}$=201.7 in this example, the result of the initial conversion of $V_{in}$ to a 12-bit digital code 110 is the value 201. Therefore, the value of $V_{DAC1}$ in this example is 201. The residue voltage that is typically discarded at this point is the remaining portion of $V_{in}$, which is 0.7. That is, $V_{in}$=$V_{DAC1}$+$V_{res1}$, where $V_{res1}$ is the residue voltage from the first conversion. At this step, each of the switches 208, 214, 224 and 234 is open. Thus, because the first signal 204 is $V_{DAC1}$ (201) and the capacitor 202a is storing $V_{in}$ (201.7), the voltage at the negative terminal of the amplifier 210 represents a negative value of $V_{res1}$ or –0.7.

Figure 4C:
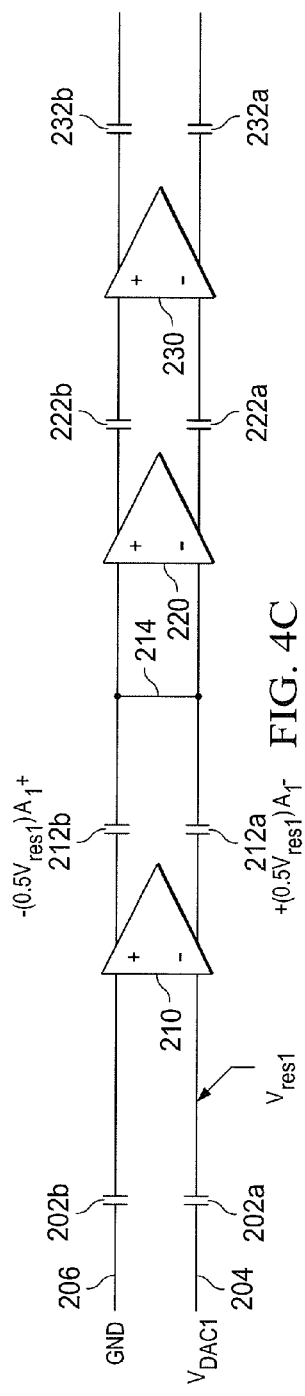

As shown in FIG. 4C, the first signal 204 remains $V_{DAC1}$, and $V_{res1}$ remains at the input to the negative terminal of the amplifier 210. At this step, the switch 214 is closed. Thus, a scaled version of the residue voltage (i.e., $V_{res1}A_1$) is stored differentially in the capacitors 212a-212b. As a result, the capacitors 212a-212b provide a first scaled version of $V_{res1}$ to be used in residue boosting for the second conversion.

As shown in FIG. 4D, for the second conversion, the first signal 204 is changed back to $V_{in}$, which is 201.7. At this step, the switch 214 has been opened, and the switch 208 is closed. Thus, at this step, the input voltage of 201.7 is again stored on the capacitor 202a.

In addition, the output of the capacitor 202a is switched to the positive terminal of the amplifier 210, and the output of the capacitor 202b is switched to the negative terminal of the amplifier 210. Therefore, $V_{comp,out}$ 122 for this second conversion represents $V_{in}$+$V_{res1}$, which corresponds to 201.7+0.7, or 202.4, in this example. From this, the enhanced resolution SAR control logic 102 generates a 12-bit digital code 110 of 202, which is the output from the second conversion. The DAC 104 then generates $V_{DAC2}$ based on the value 202.

As shown in FIG. 4E, the first signal 204 is changed to $V_{DAC2}$. For this step, the switch 208 has been opened. Thus, the value of $V_{DAC2}$–$V_{in}$=$V_{res2}$ (i.e., 202–201.7=0.3), is stored at the positive input to the amplifier 210 for use in a third conversion.

As shown in FIG. 4F, the first signal 204 remains $V_{DAC2}$, and $V_{res2}$ remains at the positive input to the amplifier 210. At this step, the switch 234 is closed. Thus, a scaled version of the difference between $V_{res2}$ and $V_{res1}$ (i.e., ($V_{res2}$–$V_{res1}$)$A_1A_2A_3$) is stored differentially in the capacitors 232a-232b. As a result, the capacitors 232a-232b provide a first scaled version of the difference between $V_{res2}$ and $V_{res1}$ to be used in residue boosting for the third conversion.

As shown in FIG. 4G, the first signal 204 remains $V_{DAC2}$, and $V_{res2}$ remains at the input to the positive terminal of the amplifier 210. At this step, the switch 234 has been opened, and the switch 224 is closed. Thus, a second scaled version of the difference between $V_{res2}$ and $V_{res1}$ (i.e., ($V_{res2}$–$V_{res1}$)$A_1A_2$) is stored differentially in the capacitors 222a-222b. As a result, the capacitors 222a-222b provide a second scaled version of the difference between $V_{res2}$ and $V_{res1}$ to be used in residue boosting for the third conversion.

As shown in FIG. 4H, the first signal 204 is changed to $V_{DAC2}$+1, which results in 203 in this example. At this step, the switch 224 has been opened, and the switches 208 and 214 are each closed. Thus, the value of $V_{DAC2}$+1, or 203, is stored on the capacitor 202a, and the residue voltage stored in the capacitors 212a-212b is cleared.

As shown in FIG. 4I, the first signal 204 is changed back to $V_{DAC2}$. At this step, the switches 208 and 214 have been opened. Thus, the value of $V_{DAC2}$–($V_{DAC2}$+1), or –1, is stored at the positive terminal of the amplifier 210. At this point, the comparator output, $V_{comp,out}$ 122 is provided by (–1+2($V_{res1}$–$V_{res2}$))$A_1A_2A_3$. For the example, this result would be –0.2$A_1A_2A_3$.

The enhanced resolution SAR control logic 102 then determines the 14-bit approximation 126 of $V_{in}$ as follows:

if $V_{comp,out}$>0, $V_{out}$=1, if $V_{comp,out}$≤0, $V_{out}$=0, and final output=2$V_{DAC1}$+2$V_{DAC2}$+$V_{out}$.

Thus, for a residue remaining from $V_{in}$+$V_{res1}$ (which in this example would be the residue from 202.4, or 0.4) that is less than or equal to 0.5, $V_{comp,out}$ is negative or zero and $V_{out}$ is 0, and for a residue that is greater than 0.5, $V_{comp,out}$ is positive and $V_{out}$ is 1. Accordingly, for the example illustrated in FIGS. 4A through 4I, $V_{out}$ is 0, and the final output is 2(201)+2(202)+0=806. This final output corresponds to the 14-bit approximation 126 of $V_{in}$. Additional examples are shown in the table below:

| $V_{in}$ | $V_{DAC1}$ | $V_{DAC2}$ | $V_{out}$ | Final output |
|---|---|---|---|---|
| 201.2 | 201 | 201 | 0 | 804 |
| 201.4 | 201 | 201 | 1 | 805 |
| 201.7 | 201 | 202 | 0 | 806 |
| 201.9 | 201 | 202 | 1 | 807 |

Figure 5:
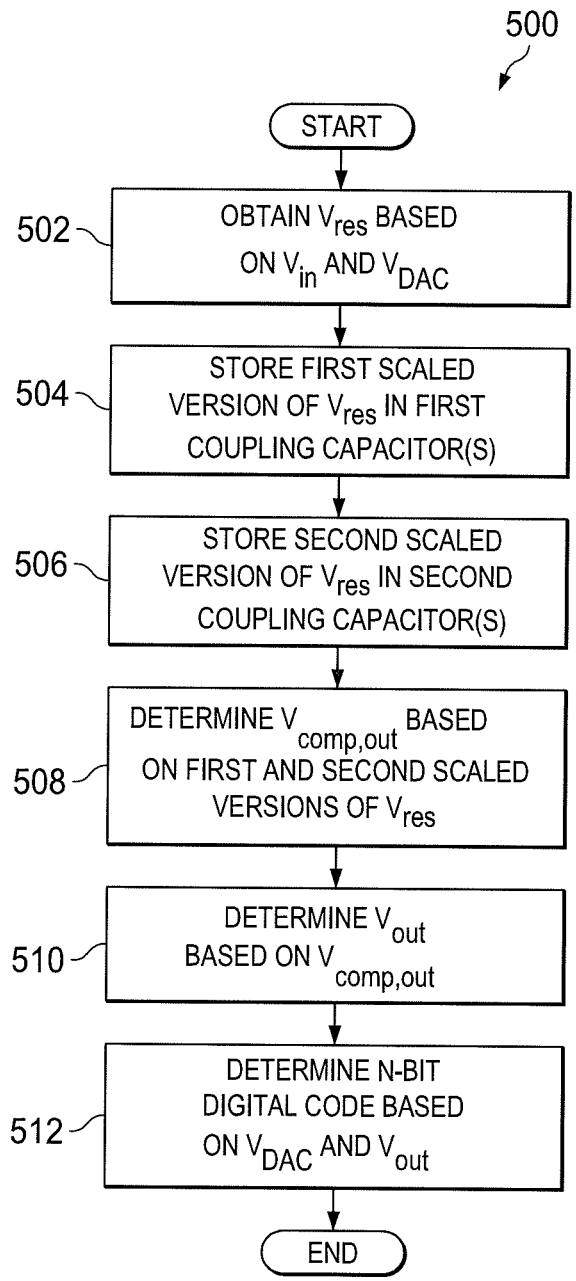
FIG. 5 illustrates a method for increasing the resolution of the SAR ADC of FIG. 1 by one bit according to an embodiment of this disclosure.

FIG. 5 illustrates a method 500 for increasing the resolution of the enhanced resolution SAR ADC 100 by one bit according to an embodiment of this disclosure. The method 500 shown in FIG. 5 is for illustration only. The resolution of the enhanced resolution SAR ADC 100 may be increased by one bit in any other suitable manner without departing from the scope of this disclosure.

Initially, a value for $V_{res}$ is obtained based on $V_{in}$ and $V_{DAC}$ (step 502). For example, as described above in connection with FIGS. 3A through 3F, $V_{res}$ can be obtained by storing $V_{in}$ in a coupling capacitor 202a of the comparator 106 and providing $V_{DAC}$ as an input signal 204 to the comparator 106. Next, a first scaled version of $V_{res}$ is stored in a first coupling capacitor or pair of differential coupling capacitors of the comparator 106 (step 504). For example, –$V_{res}A_1A_2$ can be stored in the capacitors 222a-222b. Then, a second scaled version of $V_{res}$ is stored in a second coupling capacitor or pair of differential coupling capacitors of the comparator 106 (step 506). For example, –$V_{res}A_1$ can be stored in the capacitors 212a-212b.

A value for $V_{comp,out}$ is determined based on the first and second scaled versions of $V_{res}$ stored in the coupling capacitors (step 508). For example, a value of $V_{comp,out}$ may be determined by calculating $(1-2V_{res})A_1A_2A_3$. A value for $V_{out}$ is determined based on the value of $V_{comp,out}$ (step 510). For example, $V_{out}$ may be determined as follows:

if $V_{comp,out}>0, V_{out}=0$, and if $V_{comp,out}\leq 0, V_{out}=1$.

Finally, a final output corresponding to the N-bit approximation 126 of $V_{in}$ is determined based on the values of $V_{DAC}$ and $V_{out}$ (step 512). For example, the N-bit approximation 126 of $V_{in}$ may be determined by calculating $2V_{DAC}+V_{out}$.

Figure 6:
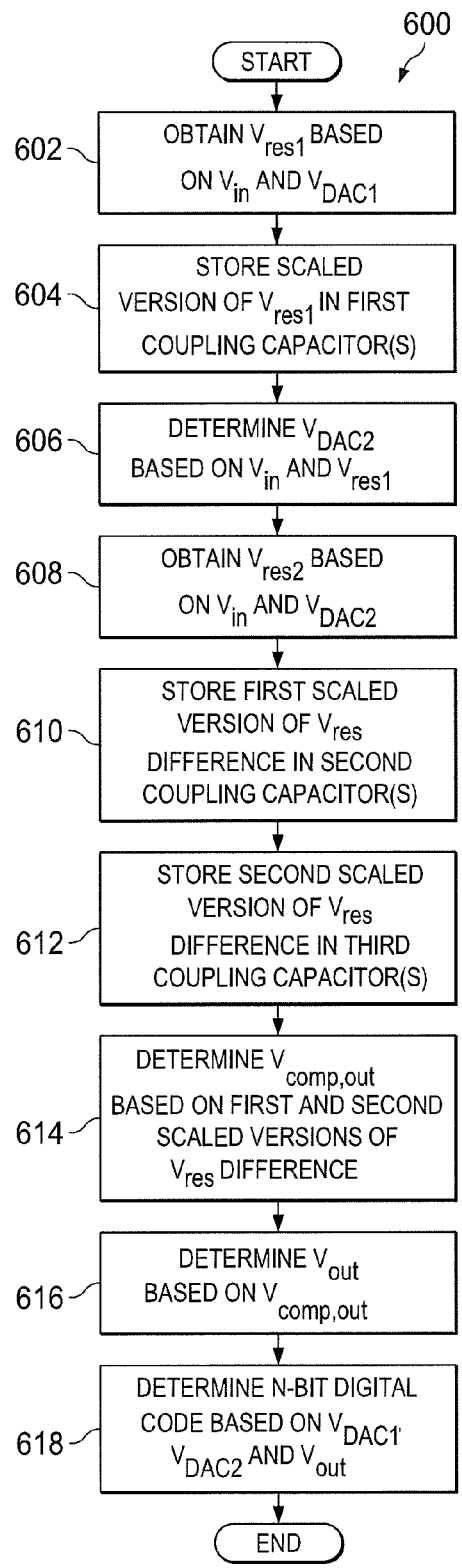
FIG. 6 illustrates a method for increasing the resolution of the SAR ADC of FIG. 1 by two bits according to an embodiment of this disclosure.

FIG. 6 illustrates a method 600 for increasing the resolution of the enhanced resolution SAR ADC 100 by two bits according to an embodiment of this disclosure. The method 600 shown in FIG. 6 is for illustration only. The resolution of the enhanced resolution SAR ADC 100 may be increased by two bits in any other suitable manner without departing from the scope of this disclosure.

Initially, a value for $V_{res1}$ is obtained based on $V_{in}$ and $V_{DAC1}$ (step 602). For example, as described above in connection with FIGS. 4A through 4I, $V_{res1}$ can be obtained by storing $V_{in}$ in an input coupling capacitor 202a of the comparator 106 and providing $V_{DAC1}$ as an input signal 204 to the comparator 106. Next, a first scaled version of $V_{res1}$ is stored in a first coupling capacitor or pair of differential coupling capacitors of the comparator 106 (step 604). For example, $-V_{res1}A_1$ can be stored in the capacitors 212a-212b.

A value for $V_{DAC2}$ is determined based on $V_{in}$ and $V_{res1}$ (step 606). For example, $V_{DAC2}$ can be obtained by switching the inputs to the positive and negative terminals of the amplifier 210 while storing $V_{in}$ in the coupling capacitor 202a and $V_{res1}$ in the coupling capacitors 212a-212b. A value for $V_{res2}$ is obtained based on $V_{in}$ and $V_{DAC2}$ (step 608). For example, $V_{res2}$ can be obtained by storing $V_{in}$ in the coupling capacitor 202a of the comparator 106 and providing $V_{DAC2}$ as an input signal 204 to the comparator 106.

A first scaled version of the difference between $V_{res1}$ and $V_{res2}$ is stored in a second coupling capacitor or pair of differential coupling capacitors of the comparator 106 (step 610). For example, $-(V_{res2}-V_{res1})A_1A_2A_3$ can be stored in the capacitors 232a-232b. A second scaled version of the difference between $V_{res1}$ and $V_{res2}$ is stored in a third coupling capacitor or pair of differential coupling capacitors of the comparator 106 (step 612). For example, $-(V_{res2}-V_{res1})A_1A_2$ can be stored in the capacitors 222a-222b.

A value for $V_{comp,out}$ is determined based on the first and second scaled versions of the difference between $V_{res1}$ and $V_{res2}$ stored in the coupling capacitors (step 614). For example, a value of $V_{comp,out}$ may be determined by calculating $(-1+2(V_{res1}-V_{res2}))A_1A_2A_3$. A value for $V_{out}$ is determined based on the value of $V_{comp,out}$ (step 616). For example, $V_{out}$ may be determined as follows:

if $V_{comp,out}>0, V_{out}=1$, and if $V_{comp,out}\leq 0, V_{out}=0$.

Finally, a final output corresponding to the N-bit approximation 126 of $V_{in}$ is determined based on the values of $V_{DAC1}$, $V_{DAC2}$ and $V_{out}$ (step 618). For example, the N-bit approximation 126 of $V_{in}$ may be determined by calculating $2V_{DAC1}+2V_{DAC2}+V_{out}$.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed:

1. An enhanced resolution successive-approximation register (SAR) analog-to-digital converter (ADC), comprising:
    a digital-to-analog converter (DAC) comprising analog circuitry configured to convert an M-bit digital input to an analog output;
    a comparator comprising a plurality of coupling capacitors; and
    enhanced resolution SAR control logic configured to generate an M-bit approximation of an input voltage; to store a residue voltage in at least one of the coupling capacitors, wherein the residue voltage comprises a difference between the input voltage and the M-bit approximation of the input voltage; and to generate an N-bit approximation of the input voltage based on the stored residue voltage, where N>M;
    wherein the residue voltage comprises a first residue voltage, and
    wherein the enhanced resolution SAR control logic is further configured to receive a comparator output based on the input voltage added to the first residue voltage; to generate an M-bit approximation of the comparator output; to store a difference between the first residue voltage and a second residue voltage in at least one second coupling capacitor, wherein the second residue voltage comprises a difference between the input voltage and the M-bit approximation of the comparator output; and to generate the N-bit approximation of the input voltage based on the stored residue voltage by generating the N-bit approximation of the input voltage based on the stored first residue voltage and the stored difference between the first and second residue voltages.

2. An enhanced resolution successive-approximation register (SAR) analog-to-digital converter (ADC), comprising:
    a digital-to-analog converter (DAC) comprising analog circuitry configured to convert an M-bit digital input to an analog output;
    a comparator comprising a plurality of coupling capacitors; and
    enhanced resolution SAR control logic configured to generate an M-bit approximation of an input voltage; to store a residue voltage in at least one of the coupling capacitors, wherein the residue voltage comprises a difference between the input voltage and the M-bit approximation of the input voltage; and to generate an N-bit approximation of the input voltage based on the stored residue voltage, where N>M;

wherein the comparator is further configured to receive the input voltage and the analog output and to generate a comparator output based on the input voltage and the analog output, and wherein the enhanced resolution SAR control logic is further configured to generate the M-bit approximation of the input voltage based on the comparator output.

3. An enhanced resolution successive-approximation register (SAR) analog-to-digital converter (ADC), comprising:

a digital-to-analog converter (DAC) comprising analog circuitry configured to convert an M-bit digital input to an analog output;

a comparator comprising a plurality of coupling capacitors; and enhanced resolution SAR control logic configured to generate an M-bit approximation of an input voltage; to store a residue voltage in at least one of the coupling capacitors, wherein the residue voltage comprises a difference between the input voltage and the M-bit approximation of the input voltage; and to generate an N-bit approximation of the input voltage based on the stored residue voltage, where N>M;

wherein the coupling capacitors comprise auto-zero capacitors.

4. An enhanced resolution successive-approximation register (SAR) analog-to-digital converter (ADC), comprising:

a digital-to-analog converter (DAC) comprising analog circuitry configured to convert an M-bit digital input to an analog output;

a comparator comprising a plurality of coupling capacitors; and enhanced resolution SAR control logic configured to generate an M-bit approximation of an input voltage; to store a residue voltage in at least one of the coupling capacitors, wherein the residue voltage comprises a difference between the input voltage and the M-bit approximation of the input voltage; and to generate an N-bit approximation of the input voltage based on the stored residue voltage, where N>M;

wherein the coupling capacitors comprise pairs of differential capacitors.

5. A method for increasing the resolution of a SAR ADC, comprising:

generating an M-bit approximation of an input voltage;

determining a residue voltage based on the input voltage and the M-bit approximation of the input voltage;

storing the residue voltage in at least one coupling capacitor; and generating an N-bit approximation of the input voltage based on the stored residue voltage, wherein N=M+1;

wherein storing the residue voltage in at least one coupling capacitor comprises storing a first scaled version of the residue voltage in a first coupling capacitor and a second scaled version of the residue voltage in a second coupling capacitor.

6. The method of claim 5, wherein the first coupling capacitor comprises a first pair of differential capacitors and the second coupling capacitor comprises a second pair of differential capacitors.

7. The method of claim 5, further comprising generating a comparator output based on the first scaled version of the residue voltage and the second scaled version of the residue voltage.

8. The method of claim 7, further comprising determining an output voltage based on the comparator output.

9. The method of claim 8, wherein generating the N-bit approximation of the input voltage based on the stored residue voltage comprises generating the N-bit approximation of the input voltage based on the M-bit approximation of the input voltage and the output voltage.

10. The method of claim 9, wherein the comparator output is a multiple of $1-2V_{res}$, where $V_{res}$ is the stored residue voltage, wherein the output voltage is 0 when the comparator output is greater than zero and the output voltage is 1 when the comparator output is less than or equal to zero, and wherein the N-bit approximation of the input voltage is provided by $2V_{DAC}+V_{out}$, where $V_{DAC}$ is the M-bit approximation of the input voltage and $V_{out}$ is the output voltage.

11. A method for increasing the resolution of a SAR ADC, comprising:

generating an M-bit approximation of an input voltage;

determining a first residue voltage based on the input voltage and the M-bit approximation of the input voltage;

storing the first residue voltage in a first coupling capacitor;

determining a second residue voltage based on the input voltage and the M-bit approximation of the input voltage;

storing a difference between the first and second residue voltages in a second coupling capacitor and a third coupling capacitor; and generating an N-bit approximation of the input voltage based on the stored difference, wherein N=M+2.

12. The method of claim 11, wherein storing the difference between the first and second residue voltages comprises storing a first scaled version of the difference in the second coupling capacitor and a second scaled version of the difference in the third coupling capacitor.

13. The method of claim 12, wherein the first coupling capacitor comprises a first pair of differential capacitors, the second coupling capacitor comprises a second pair of differential capacitors, and the third coupling capacitor comprises a third pair of differential capacitors.

14. The method of claim 12, further comprising generating a final comparator output based on the first scaled version of the difference and the second scaled version of the difference.

15. The method of claim 14, further comprising determining an output voltage based on the final comparator output.

16. The method of claim 15, further comprising:

adding the input voltage to the first residue voltage to generate an intermediate comparator output; and generating an M-bit approximation of the intermediate comparator output, wherein generating the N-bit approximation of the input voltage based on the stored difference comprises generating the N-bit approximation of the input voltage based on the M-bit approximation of the input voltage, the M-bit approximation of the intermediate comparator output, and the output voltage.

17. The method of claim 16, wherein the comparator output is a multiple of $-1+2(V_{res1}-V_{res2})$, where $V_{res1}$ is the first residue voltage and $V_{res2}$ is the second residue voltage, wherein the output voltage is 1 when the comparator output is greater than zero and the output voltage is 0 when the comparator output is less than or equal to zero, and wherein the N-bit approximation of the input voltage is provided by $2V_{DAC1}+2V_{DAC2}+V_{out}$, where $V_{DAC1}$ is the M-bit approximation of the input voltage, $V_{DAC2}$ is the M-bit approximation of the intermediate comparator output, and $V_{out}$ is the output voltage.

* * * * *